(12) United States Patent
Wang et al.

(10) Patent No.: US 8,357,566 B2
(45) Date of Patent: Jan. 22, 2013

(54) PRE-ENCAPSULATED LEAD FRAMES FOR MICROELECTRONIC DEVICE PACKAGES, AND ASSOCIATED METHODS

(75) Inventors: Ai-Chie Wang, Singapore (SG); Choon Kuan Lee, Singapore (SG); Chin Hui Chong, Singapore (SG); Wuu Yean Tay, Singapore (SG)

(73) Assignee: Micron Technology, Inc., Boise, ID (US)

( * ) Notice: Subject to any disclaimer, the term of this patent is extended or adjusted under 35 U.S.C. 154(b) by 1319 days.

(21) Appl. No.: 11/510,026

(22) Filed: Aug. 25, 2006

(65) Prior Publication Data

US 2008/0048301 A1 Feb. 28, 2008

(51) Int. Cl.
*H01L 21/00* (2006.01)

(52) U.S. Cl. ........ 438/112; 438/106; 438/123; 438/127; 257/666; 257/671

(58) Field of Classification Search .................. 438/106, 438/123, 127, 112, 111; 257/666, 671
See application file for complete search history.

(56) References Cited

U.S. PATENT DOCUMENTS

| | | | |
|---|---|---|---|
| 4,701,999 A * | 10/1987 | Palmer | 29/827 |
| 5,332,864 A | 7/1994 | Liang et al. | |
| 6,071,758 A * | 6/2000 | Steffen | 438/112 |
| 6,576,494 B1 | 6/2003 | Farnworth | |
| 6,838,760 B1 * | 1/2005 | Cobbley | 257/680 |
| 2003/0008433 A1 | 1/2003 | Corisis et al. | |
| 2005/0012185 A1 * | 1/2005 | Peng et al. | 257/666 |
| 2007/0001278 A1 * | 1/2007 | Jeon et al. | 257/676 |
| 2007/0130759 A1 * | 6/2007 | Harnden et al. | 29/827 |

FOREIGN PATENT DOCUMENTS

EP 0484772 A2 5/1992

OTHER PUBLICATIONS

Search Report and Examination Report issued Dec. 24, 2008 for Singapore Patent Application No. 200605817-6.

\* cited by examiner

*Primary Examiner* — Junghwa M Im
(74) *Attorney, Agent, or Firm* — Perkins Coie LLP

(57) ABSTRACT

Pre-encapsulated lead frames suitable for use in microelectronic device packages are disclosed. Individual lead frames can include a set of multiple lead fingers arranged side by side with neighboring lead fingers spaced apart from each other by a corresponding gap. An encapsulating compound at least partially encapsulates the set of lead fingers without encapsulating a microelectronic device. The encapsulating compound can generally fill the plurality of gaps between two adjacent lead fingers.

35 Claims, 10 Drawing Sheets

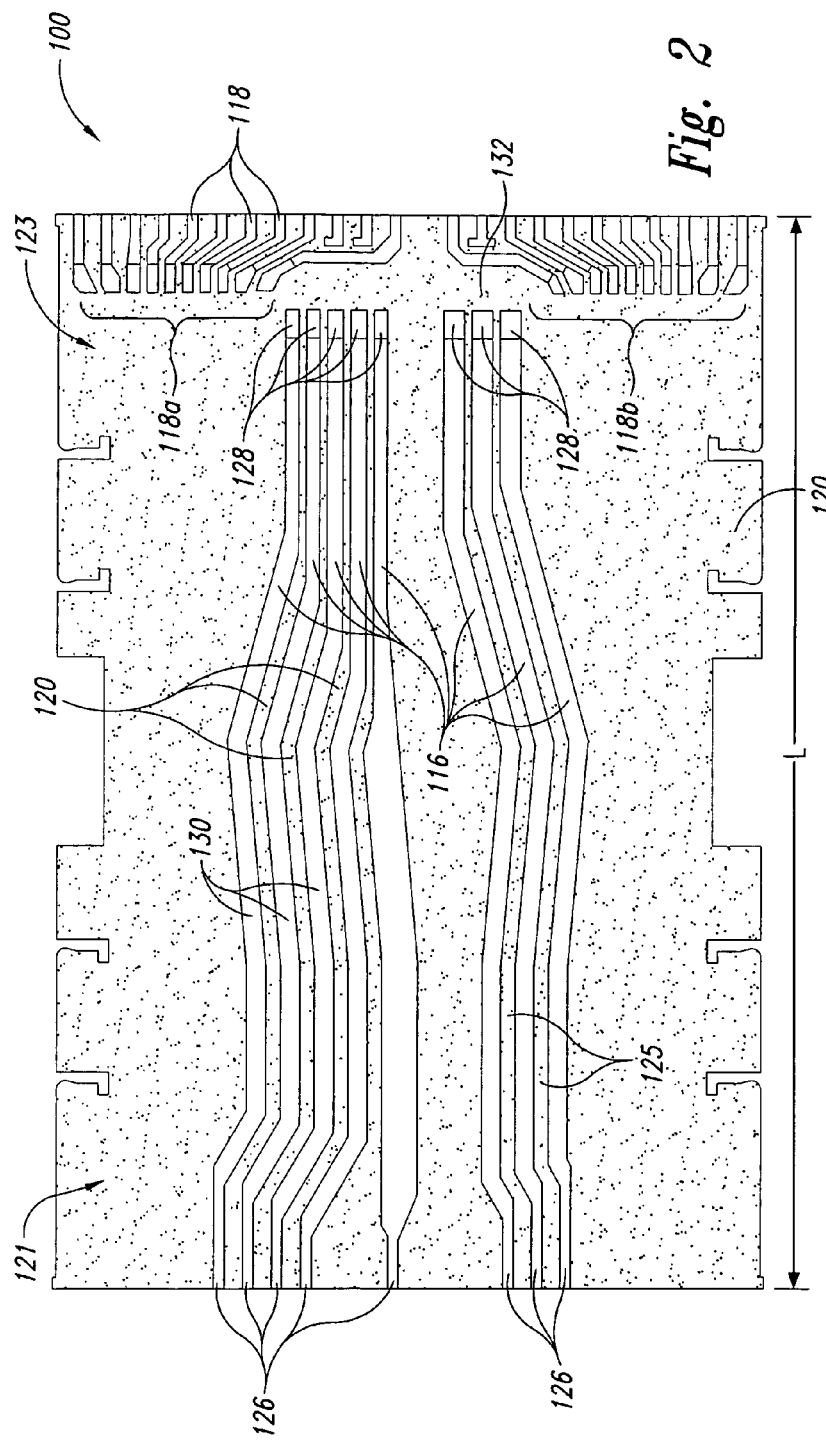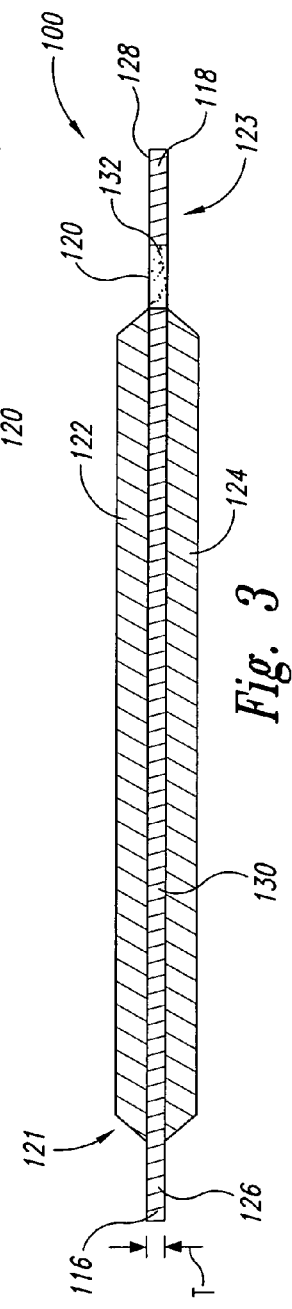

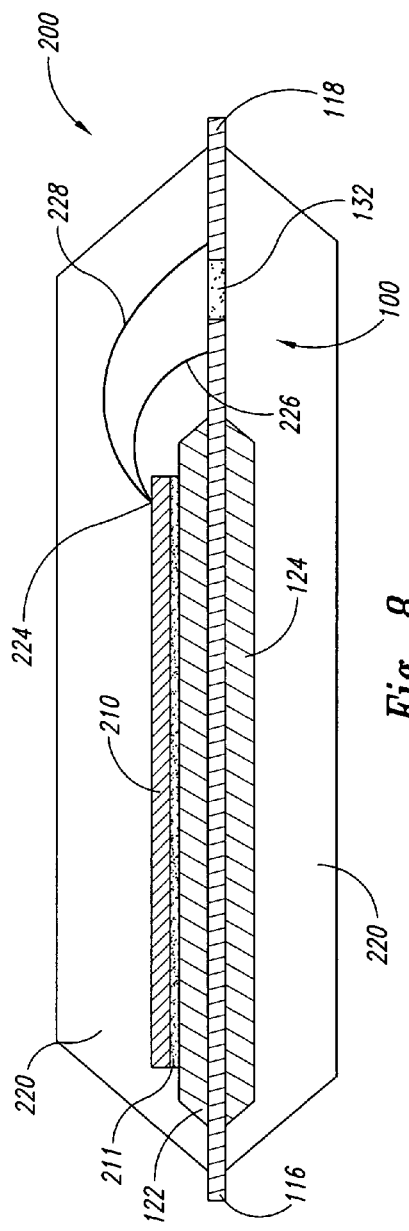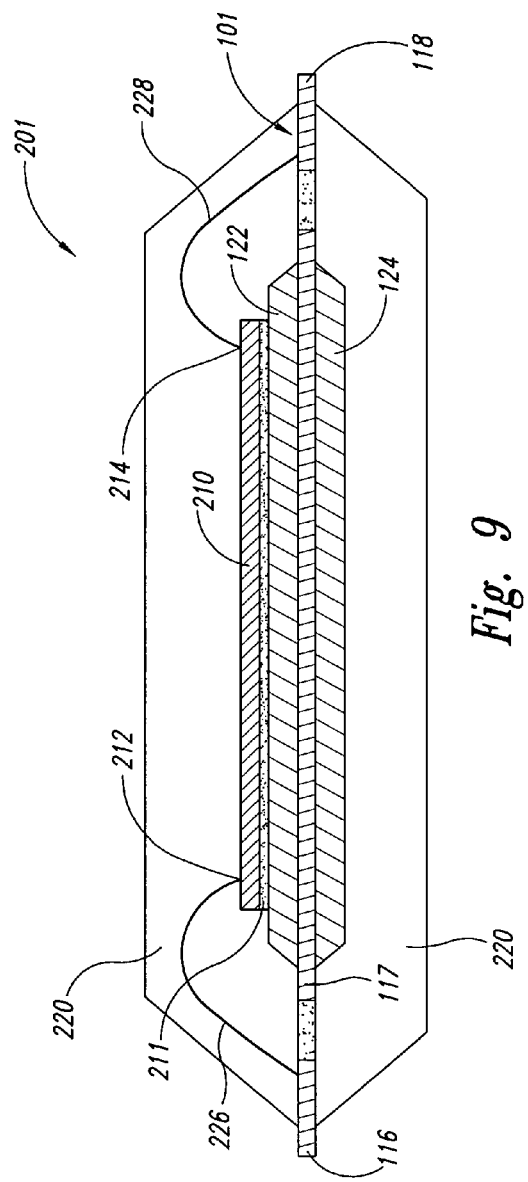

PRE-ENCAPSULATED LEAD FRAMES FOR MICROELECTRONIC DEVICE PACKAGES, AND ASSOCIATED METHODS

TECHNICAL FIELD

The present disclosure relates to microelectronic device packages having pre-encapsulated lead frames, and methods for manufacturing such microelectronic device packages.

BACKGROUND

Microelectronic devices generally have a die (i.e., a chip) that includes integrated circuitry with a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, and etching). The dies typically include an array of very small bond-pads electrically coupled to the integrated circuitry. The bond-pads are external electrical contacts through which the supply voltage, signals, etc., are transmitted to and from the integrated circuitry. After forming the dies, the wafer is thinned by backgrinding, and then the dies are separated from one another (i.e., singulated) by dicing the wafer. Next, the dies are "packaged" to couple the bond-pads to a larger array of electrical terminals that can be more easily coupled to the various power supply lines, signal lines, and ground lines. Conventional processes for packaging dies include electrically coupling the bond-pads on the dies to an array of leads, ball-pads, or other types of electrical terminals, and then encapsulating the dies to protect them from environmental factors (e.g., moisture, particulates, static electricity, and physical impact).

FIG. 1 illustrates an existing microelectronic device package 10. The package 10 includes a microelectronic device 12 having a first end 21 and a second end 23, a lead frame 15 supporting the microelectronic device 12, and a packaging material 24 (shown in phantom lines for clarity) encapsulating the lead frame 15 and the microelectronic device 12. The microelectronic device 12 includes bond pads 14 positioned toward the second end 23. The lead frame 15 includes first lead fingers 16 that extend under the microelectronic device 12 from the first end 21 toward the second end 23. The lead frame 15 also includes second lead fingers 18 positioned toward the second end 23 of the microelectronic device 12. The bond pads 14 are grouped into three sets of bond pads 14a-c. First and third sets of bond pads 14a, 14c are electrically connected to the second lead fingers 18 with corresponding first and third wirebonds 20a, 20c, and the second set of bond pads 14b is electrically connected to the first lead fingers 16 with second wirebonds 20b.

During assembly, the microelectronic device 12 is disposed on the first lead fingers 16. The bond pads 14a-c are connected to the first and second lead fingers 16, 18 using the wirebonds 20a-c. The first and second lead fingers 16, 18 together with the microelectronic device 12 are then disposed in a molding cavity. Liquefied packaging material 24 is injected into the molding cavity to encapsulate the microelectronic device 12 and the first and second lead fingers 16, 18.

One drawback associated with the microelectronic device package 10 is that the first lead fingers 16 and/or the second lead fingers 18 can shift during handling, transporting, assembling, or other processes. The first lead fingers 16 are especially prone to shifting because the first lead fingers 16 typically span almost the entire length L of the package 10. A small shift in neighboring first lead fingers 16 can cause the microelectronic device 12 to short circuit.

Another drawback associated with the microelectronic device package 10 is that the co-planarity of the first and second lead fingers 16, 18 cannot always be maintained during assembly. For example, the first lead fingers 16 can move out of the plane of FIG. 1 before or during the molding process so as to be offset from the second lead fingers 18. Further, the weight of the microelectronic device 12 can also cause the first lead fingers 16 to tilt or depress relative to the second lead fingers 18. If the first lead fingers 16 are not located in the proper plane, the encapsulation process may not properly encapsulate the entire package 10.

One conventional approach for reducing lead finger shifting is to secure the first lead fingers 16 and/or the second lead fingers 18 with adhesive tape. As illustrated in FIG. 1, adhesive tape strips 22a-c can be attached to the back sides of the first lead fingers 16 to prevent the first lead fingers 16 from moving. However, incorporating the adhesive tape strips 22a-c in the microelectronic device package 10 can reduce its reliability. For example, the adhesive tape strips 22a-c can absorb moisture, which can cause circuit failure in the microelectronic device 12. The adhesive tape strips 22a-c can also have different thermal expansion characteristics than other components of the microelectronic device package 10, which can cause cracking during operation. Accordingly, there is a need to provide more reliable and/or more robust packaging techniques.

BRIEF DESCRIPTION OF THE DRAWINGS

FIG. 2 is a top view of a portion of a pre-encapsulated lead frame configured in accordance with an embodiment of the invention.

FIG. 3 is a cross-sectional view of the pre-encapsulated lead frame shown in FIG. 2 configured in accordance with an embodiment of the invention.

FIG. 8 is a cross-sectional view of a microelectronic device package incorporating a pre-encapsulated lead frame configured in accordance with an embodiment of the invention.

FIG. 9 is a cross-sectional view of a microelectronic device package incorporating a pre-encapsulated lead frame having a die paddle in accordance with still another embodiment of the invention.

DETAILED DESCRIPTION

Figure 1:
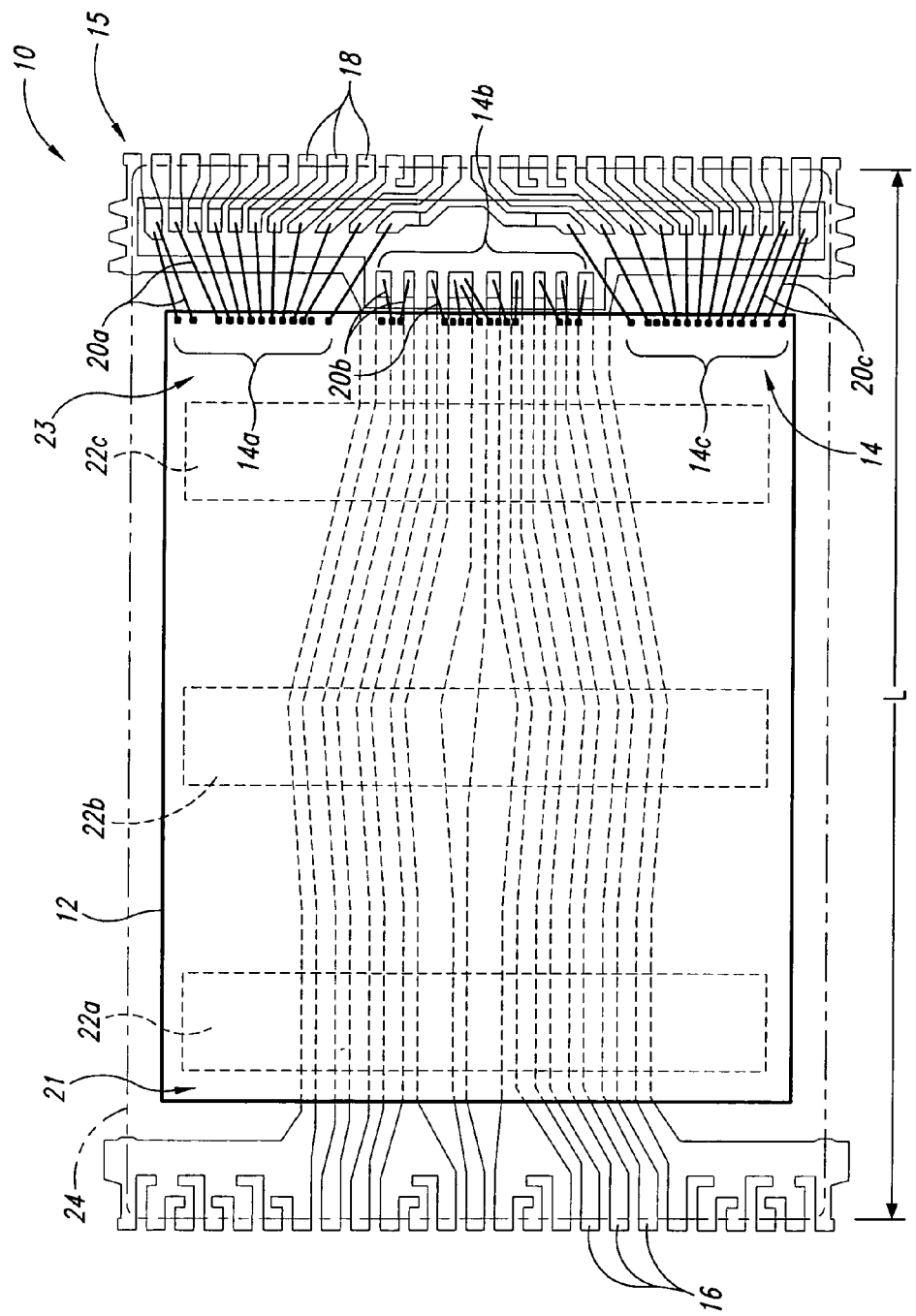
FIG. 1 is a partially exploded top view of a microelectronic device package configured in accordance with the prior art.

The present disclosure describes pre-encapsulated lead frames for microelectronic device packages, and associated methods. It will be appreciated that several of the details set forth below are provided to describe the following embodiments in a manner sufficient to enable a person skilled in the relevant art to make and use the disclosed embodiments. Several of the details described below, however, may not be necessary to practice certain embodiments of the invention. Additionally, the invention can include other embodiments that are within the scope of the claims but are not described in detail with respect to FIGS. 2-15.

FIG. 2 is a top view and FIG. 3 is a cross-sectional view of a portion of a pre-encapsulated lead frame 100 configured in accordance with an embodiment of the invention. Referring to FIGS. 2 and 3 together, the pre-encapsulated lead frame 100 can include first lead fingers 116, second lead fingers 118 spaced apart from the first lead fingers 116 in a lengthwise direction, and an encapsulating compound 120 (e.g., an epoxy molding compound) at least partially encapsulating the first and second lead fingers 116, 118. The pre-encapsulated lead frame 100 can have a generally sheet-like shape. The lead frame 100 can include a first strengthening layer 122 and a second strengthening layer 124, which are not shown in FIG. 2 so as to make the underlying encapsulating compound 120 visible.

For purposes of illustration, the outermost extremities of the first and second lead fingers 116, 118 are not shown in FIGS. 2 and 3. These extremities are typically protected from exposure to the encapsulating compound 120 by a dam bar. After package encapsulation, the outermost extremities are typically trimmed to form external terminals, in a manner known to those of ordinary skill in the relevant art.

In the illustrated embodiment, the first lead fingers 116 can extend over at least 80% of the length L of the pre-encapsulated lead frame 100 from a first end 121 toward a second end 123 of the lead frame 100. The first lead fingers 116 can include a first connection portion 126 proximate to the first end 121, a second connection portion 128 proximate to the second end 123, and a support portion 130 between the first and second connection portions 126, 128. The support portion 130 can be configured to support one or more microelectronic devices (not shown). The first and second connection portions 126, 128 are external to the strengthening layers 122, 124 and are therefore exposed for electrical connection to a subsequently-positioned microelectronic device. A first dam bar (not shown) can join the first lead fingers 116 proximate to the first connection portions 126 and is trimmed after encapsulation to electrically isolate neighboring lead fingers. In the illustrated embodiment, the first lead fingers 116 have a zig-zag profile. In other embodiments, the first lead fingers 116 can have another profile including, for example, a straight profile, a serpentine profile, or a wavy profile.

The first lead fingers 116 can be arranged side by side and spaced apart by corresponding gaps 125 (FIG. 2). The encapsulating compound 120 can be disposed in the gaps 125 so as to generally fill the gaps 125 and at least partially (and in at least some cases, completely) encapsulate the first lead fingers 116. In one embodiment, the encapsulating compound 120 can have a thickness less than a thickness T (FIG. 3) of the first lead fingers 116. In other embodiments, the encapsulating compound 120 in the gaps 125 can have a thickness generally equal to or greater than the thickness T of the first lead fingers 116.

The second lead fingers 118 can be spaced apart from the first lead fingers 116 in a lengthwise direction by a space 132. The encapsulating compound 120 can fill the space 132 so as to maintain the first and second lead fingers 116, 118 in a generally co-planar alignment. A second dam bar (not shown) can temporarily join the second lead fingers 118 during encapsulation, and is removed after encapsulation. In the illustrated embodiment, the second lead fingers 118 include a first group 118a and a second group 118b, each of which is positioned to align with corresponding bond sites on a corresponding microelectronic device. In other embodiments, the second lead fingers 118 can be grouped together, or can have other arrangements, depending on the configuration of the microelectronic device. The first and second lead fingers 116, 118 can be constructed from any material that has suitable strength and electrical conductivity. For example, suitable materials can include metals (e.g., copper, aluminum, zinc, etc.), metal alloys (e.g., Ni42%-58% Fe, etc.), or a combination of metals and metal alloys.

Referring now to FIG. 3, the pre-encapsulated lead frame 100 can optionally include the first strengthening layer 122 and/or the second strengthening layer 124 on opposing sides of at least a section of the support portion 130 for strengthening the support portion 130. In one embodiment, the strengthening layers 122, 124 can include a layer of the encapsulating compound 120. In other embodiments, the strengthening layers 122, 124 can be formed from polyurethane, Teflon, Kevlar, or other materials suitable for strengthening the support portion 130.

The pre-encapsulated lead frame 100 can be pre-encapsulated without encapsulating a microelectronic device, using techniques such as transfer molding. For example, the first and second lead fingers 116, 118 can be secured in a desired configuration prior to molding, using pins, clips, screws, or other fasteners. The fastened first and second lead fingers 116, 118 can then be placed in a molding cavity without the microelectronic device. A liquefied encapsulating compound 120 can then be injected into the molding cavity to encapsulate the first and second lead fingers 116, 118. An operator can achieve the desired thickness for the first and/or second strengthening layers 122, 124 by selecting an appropriate mold shape, and/or a velocity and a viscosity of the liquefied encapsulating compound 120. The encapsulated first and second lead fingers 116, 118 can then be cured to form the pre-encapsulated lead frame 100.

In another example, the pre-encapsulated lead frame 100 can be pre-encapsulated using a film-assisted molding technique. A film (e.g., a piece of tape, not shown) can be taped to portions of the lead fingers 116, 118 to prevent the encapsulating compound 120 from being deposited on the taped portions during molding. The liquefied encapsulating compound 120 can then be injected into the molding cavity to encapsulate the first and second lead fingers 116, 118 while the film remains on the lead fingers 116, 118. After molding, the film may be removed to leave the taped portions of the first and second lead fingers 116, 118 free of the encapsulating compound 120. In other examples, the pre-encapsulated lead frame 100 can be assembled using other molding techniques including, for example, compression molding, injection molding, extrusion molding, blow molding, rotational molding, thermoforming, and reaction injection molding.

The encapsulating compound 120 can generally fill the space 132 and the gaps 125 (FIG. 2) and can form an at least partially rigid entity with the first and second lead fingers 116, 118. Accordingly, the encapsulating compound 120 can fix the first and second lead fingers 116, 118 relative to each other to at least reduce and in many cases eliminate lead finger shifting during handling, transporting, assembling, or other processes. The encapsulating compound 120 can also provide a strengthened support for a microelectronic device that is subsequently disposed on the lead frame 100. Further, the encapsulating compound 120 can keep the first and second lead fingers 116, 118 at least approximately co-planar by maintaining the relative positions of the first and second lead fingers 116, 118 after molding and curing.

In addition, the pre-encapsulated lead frame 100 can enable higher throughput in molding operations. Conventional techniques typically include encapsulating a matrix of 2×9 lead frames, with corresponding microelectronic devices attached, all at once using a transfer molding technique. Additional lead frames cannot be easily added to the matrix because the long lead fingers may lack the structural strength to support microelectronic devices in the larger matrix. Thus, by pre-encapsulating the first and second lead fingers 116, 118, the encapsulating compound 120 can act as a stiffener to provide additional strength to the lead frame matrix. As a result, a matrix incorporating an increased number of pre-encapsulated lead frames, along with corresponding microelectronic devices, can be molded during a single molding operation, which can increase throughput and overall operational efficiency.

Figure 4:
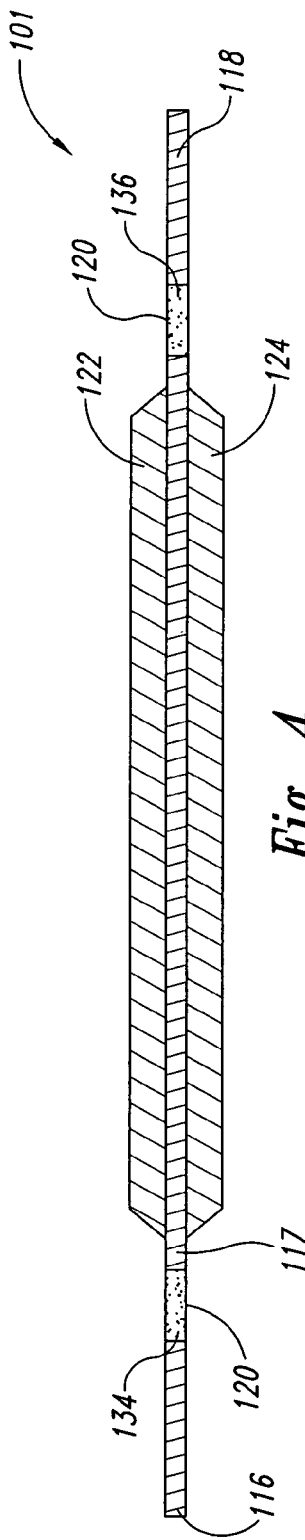
FIG. 4 is a cross-sectional view of a pre-encapsulated lead frame incorporating a die paddle in accordance with another embodiment of the invention.

FIGS. 4-7 illustrate lead frames 101-104 that are generally similar to the lead frame 100 shown in FIGS. 2-3 in that they each include an encapsulating compound 120 as a stiffening component. However, the lead frames 101-104 can also include additional and/or different features. For example, FIG. 4 illustrates a pre-encapsulated lead frame 101 that includes a die paddle (e.g., a third lead finger 117) spaced apart from but generally co-planar with the first and second lead fingers 116, 118 in a lengthwise direction. The first lead fingers 116 can extend around the die paddle 117, e.g., behind the plane of FIG. 4. The die paddle 117 can provide additional access for electrical connections to a microelectronic device that is carried by the lead frame 101. A first space 134 separates the die paddle 117 from the first lead fingers 116. A second space 136 separates the die paddle 117 from the second lead fingers 118. The encapsulating compound 120 can generally fill the first and second spaces 134, 136 to fix the position of the die paddle 117 relative to the first and second lead fingers 116, 118. The lead frame 101 can optionally include one or both of the first and second strengthening layers 122, 124 positioned on the die paddle 117.

Figure 5:
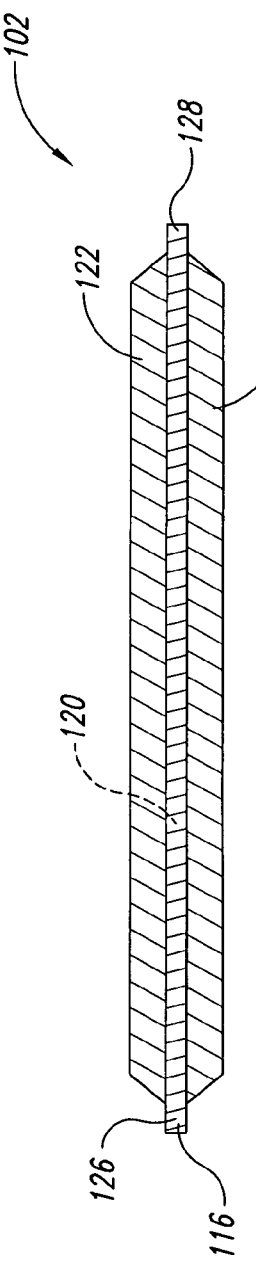
FIG. 5 is a cross-sectional view of a pre-encapsulated lead frame having only one set of lead fingers in accordance with still another embodiment of the invention.

In another embodiment shown in FIG. 5, a pre-encapsulated lead frame 102 has no second lead fingers 118. The second lead fingers 118 can be omitted from the pre-encapsulated lead frame 102, for example, by severing the right-hand portion of pre-encapsulated lead frame 100 of FIG. 3, or by encapsulating a lead frame that does not include the second lead fingers 118 at all. The lead frame 102 can thus include the encapsulating compound 120 (located behind the plane of FIG. 5) at least partially encapsulating only the first lead fingers 116. The lead frame 102 can optionally include at least one of the first and second strengthening layers 122, 124 positioned on the first lead fingers 116. The lead frame 102 can be used as an interposer for distributing signals to and/or from a microelectronic device, as described in more detail below with reference to FIG. 14.

Figure 6:
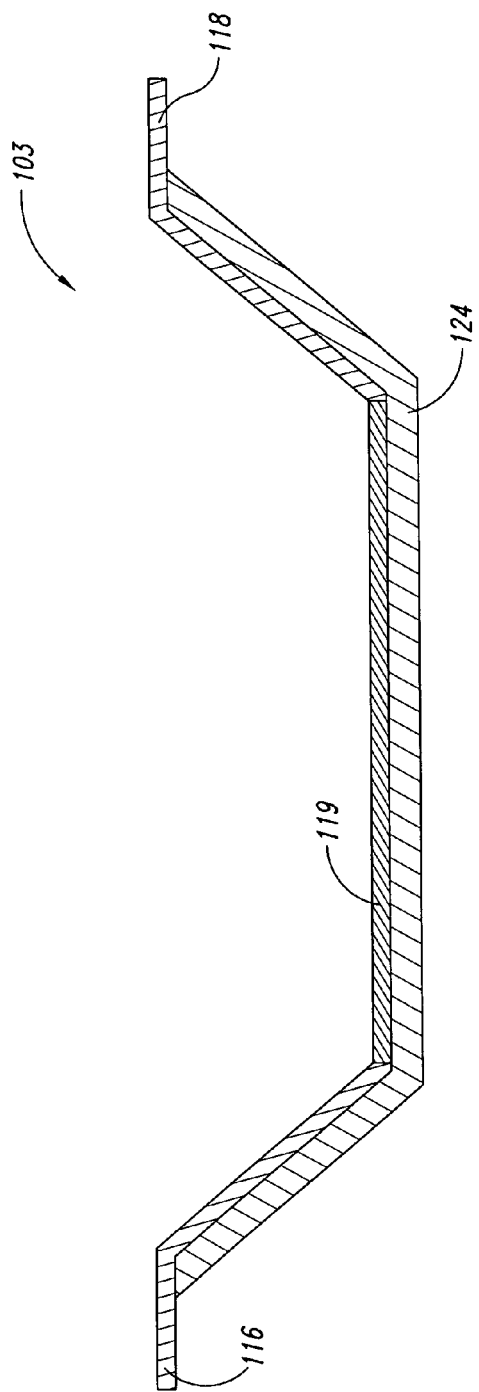
FIG. 6 is a cross-sectional view of a pre-encapsulated lead frame incorporating an offset die paddle in accordance with yet another embodiment of the invention.

FIG. 6 illustrates a pre-encapsulated lead frame 103 that can include a die paddle 119 that is offset from the first and second lead fingers 116, 118. The offset die paddle 119 can provide a support platform for a stack of multiple microelectronic devices (not shown). In the illustrated embodiment, the pre-encapsulated lead frame 103 includes only the second strengthening layer 124, but in other embodiments, the pre-encapsulated lead frame 103 can include the first strengthening layer 122 (FIG. 5) in addition to and/or in lieu of the second strengthening layer 124.

Figure 7:
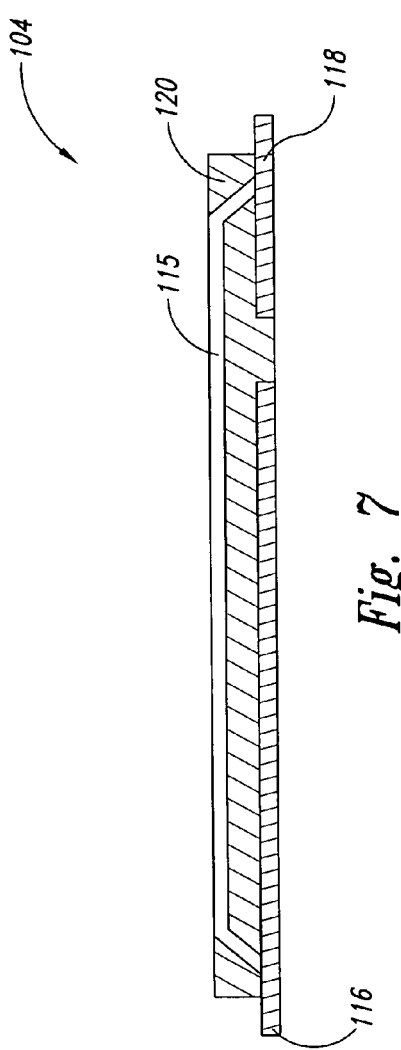
FIG. 7 is a cross-sectional view of a pre-encapsulated lead frame incorporating offset lead fingers in accordance with still another embodiment of the invention.

FIG. 7 illustrates a pre-encapsulated lead frame 104 that includes first and second lead fingers 116, 118 positioned in a first plane, and third lead fingers 115 positioned in a second plane offset from the first plane. The third lead fingers 115 can be electrically connected to the first and/or second lead fingers 116, 118 to provide a ground/power plane for a microelectronic device that is subsequently supported by the lead frame 104. In particular, the third lead fingers 115 can contain an increased volume of metal for enhanced device performance. By contrast, the two-dimensional layout of a conventional lead frame limits the volume of metal in ground/power lead fingers. To increase the volume of metal in those lead fingers, the designer must typically reduce the volume of metal in other lead fingers which can adversely affect signal speed. However, by positioning the third lead fingers 115 in the second plane, as shown in FIG. 7, the volume of metal for the ground/power lead fingers can be increased without affecting the two-dimensional layout of other lead fingers in the first plane.

In further embodiments, the lead frames 100-104 can have different and/or additional components. For example, the first lead fingers 116 can be constructed from a conductive material that has greater mechanical strength than that of the second lead fingers 118. The first and second lead fingers 116, 118 can also have arrangements different than those shown in FIGS. 2-7.

FIGS. 8-13 are cross-sectional views of microelectronic device packages 200-205 that incorporate the pre-encapsulated lead frames 100-103 described above with reference to FIGS. 2-6. In FIGS. 8-13, several components of the microelectronic device packages 200-205 are similar to the corresponding components of the lead frames 100-103 described above. As such, like reference symbols generally refer to like components in FIGS. 2-6.

The microelectronic device packages 200-205 can include various types of semiconductor devices, including without limitation, Dynamic Random Access Memory (DRAM) devices, Arrhythmic Logic Units (ALUs), Static Random Access Memory (SRAM) devices, or Application Specific Integrated Circuits (ASICs). The microelectronic device packages 200-205 can have any of a variety of package configurations, including without limitation, Thin Small Outline Packages (TSOP), Small Outline Integrated Circuits (SOIC), Thin Shrink Small Outline Packages (TSSOP), or Small Shrink Outline Packages (SSOP).

FIG. 8 is a cross-sectional view of a microelectronic device package 200 incorporating the pre-encapsulated lead frame 100 shown in FIGS. 2-3, and configured in accordance with an embodiment of the invention. The microelectronic device package 200 can include a microelectronic device 210 supported by the lead frame 100, and a packaging material 220 encapsulating the microelectronic device 210 and the lead frame 100. The microelectronic device 210 can include functional components (not shown), such as memory cells, processor circuits, and interconnecting circuitry. The microelectronic device 210 can also include bond pads 224 electrically coupled to the functional components via circuitry internal to the microelectronic device. The bond pads 224 can be coupled to the first and second lead fingers 116, 118 via corresponding wirebonds 226, 228. In the illustrated embodiment, the bond pads 224 of the microelectronic device 210 are located toward one end of the microelectronic device 210. In other embodiments, the microelectronic device 210 can include other arrangements of bond pads including, for example, centered column bond pads or double-sided bond pads.

In the illustrated embodiment, the lead frame 100 includes the (optional) first and second strengthening layers 122, 124. Accordingly, an adhesive layer 211 attaches the microelectronic device 210 to the first strengthening layer 122. In another embodiment, the adhesive layer 211 can attach the microelectronic device 210 to the second strengthening layer 122. In other embodiments, the first and second strengthening layers 122, 124 can be omitted, and the adhesive layer 211 can attach the microelectronic device 210 directly to the first lead fingers 116.

The package 200 can be encapsulated with the packaging material 220 using any of the techniques described above with reference to FIGS. 2-3. The packaging material 220 can include any suitable plastic, ceramic, or other protective covering. For example, the packaging material 220 can include an epoxy compound. The packaging material 220 can accordingly have a composition that is the same as or different than that of the encapsulating compound 120, depending upon the particular application. After the encapsulation process is complete, portions of the lead frame 100 projecting outside the packaging material 220 can be trimmed to form external leads for the package 200.

Because the first and second lead fingers 116, 118 are held in place with the encapsulating compound 120 (FIG. 3), the lead frame 100 need not include adhesive tape. Eliminating adhesive tape for securing the first and/or second lead fingers 116, 118 can improve the reliability of the microelectronic device package 200 because the adhesive tape can absorb moisture and can have different thermal expansion characteristics than other components of the microelectronic device package 200. Further, the stabilizing effect of encapsulating compound 120 can allow the manufacturer to use first and/or second lead fingers 116, 118 having a variety of different shapes, lengths, alignments, or other features without inducing lead shift, lead tilt, or other lead configuration issues.

FIG. 9 illustrates a microelectronic device package 201 incorporating an embodiment of the pre-encapsulated lead frame 101 described above with reference to FIG. 4. The lead frame 101 includes a die paddle (e.g., a third lead finger) 117 that supports the microelectronic device 210. The microelectronic device 210 can include first bond pads 212 and second bond pads 214 located toward opposite ends of the microelectronic device 210. The first bond pads 212 can be electrically connected to the first lead fingers 116 using first wirebonds 226, and the second bond pads 214 can be electrically connected to the second lead fingers 118 using second wirebonds 228.

Figure 10:
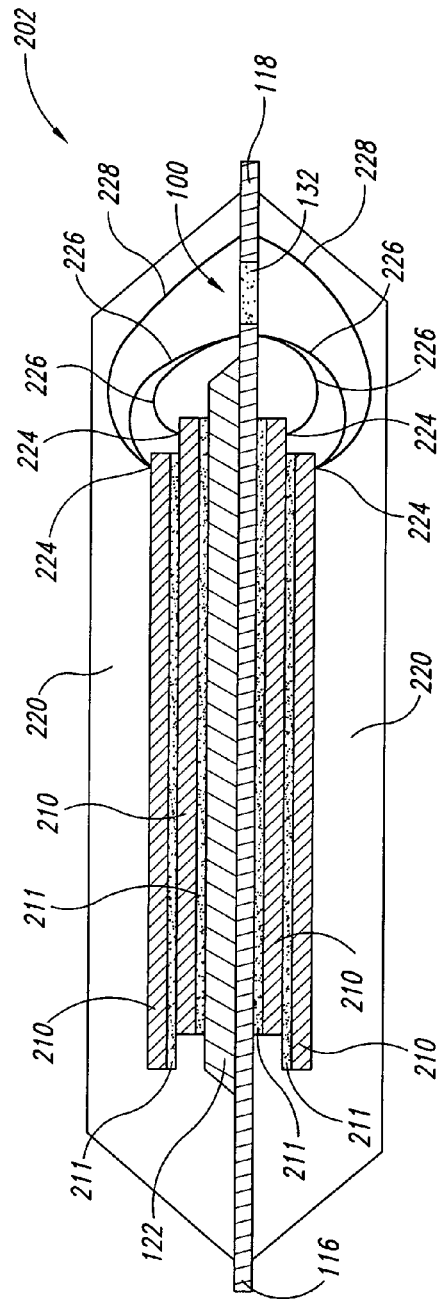
FIG. 10 is a cross-sectional view of a microelectronic device package incorporating multiple microelectronic devices in a two-sided arrangement in accordance with yet another embodiment of the invention.

FIG. 10 illustrates a microelectronic device package 202 incorporating an embodiment of the pre-encapsulated lead frame 100 described above with reference to FIGS. 2-3. The package 202 can include two microelectronic devices 210 disposed on one side of the lead frame 100, and two microelectronic devices 210 disposed on the other side of the lead frame 100 using corresponding adhesive layers 211. The microelectronic devices 210 include single-sided bond pads 224 that are electrically connected to the first lead fingers 116 with first wirebonds 226, and to the second lead fingers 118 with second wirebonds 228.

Incorporating the pre-encapsulated lead frame 100 into the microelectronic device package 202 can reduce or eliminate the risk of having air pockets between adjacent first and second lead fingers 116, 118. Such air pockets may be present when conventional techniques are used to form the package 202. For example, a conventional technique for forming a package configured similarly to the package 202 shown in FIG. 10 includes positioning microelectronic devices on both sides of the lead fingers before the subassembly is transferred to a molding cavity. Because the microelectronic devices cover a large portion of the gaps between adjacent lead fingers, these gaps can only be accessed through openings near the ends of the lead fingers. When a liquefied packaging material is injected into the molding cavity, the packaging material may lack sufficient pressure to fill up the gaps through these openings because other design considerations (e.g., deformation of wirebonds) can limit the amount of pressure applied. As a result, air pockets can remain between adjacent lead fingers. The air pockets can decrease the reliability of the package by interrupting heat removal. The air pockets can also cause the package to delaminate at high temperatures. However, embodiments of the pre-encapsulated lead frame 100 can reduce or eliminate the presence of air pockets because the encapsulating compound 120 can generally fill the gaps between adjacent lead fingers prior to encapsulating the entire assembly.

Figure 11:
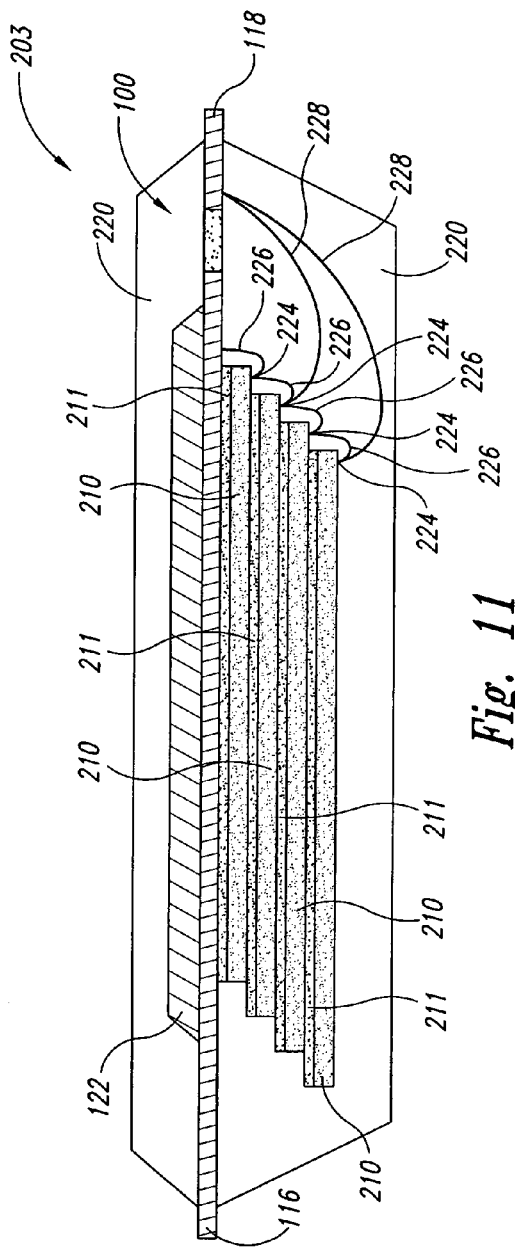
FIG. 11 is a cross-sectional view of a microelectronic device package incorporating multiple microelectronic devices in a one-sided arrangement in accordance with another embodiment of the invention.

FIG. 11 illustrates a microelectronic device package 203 incorporating an embodiment of the lead frame 100 described above with reference to FIGS. 2-3. The package 203 can include four microelectronic devices 210 mounted on a first side of the lead frame 100 using adhesive layers 211. The package 203 can also include a first strengthening layer 122 located on a second side of the lead frame 100 opposite the first side. The bond pads 224 of the microelectronic devices 210 include single-sided bond pads electrically connected to the first lead fingers 116 and to each other via first wirebonds 226. Second wirebonds 228 connect the bond pads 224 to the second lead fingers 118.

Figure 12:
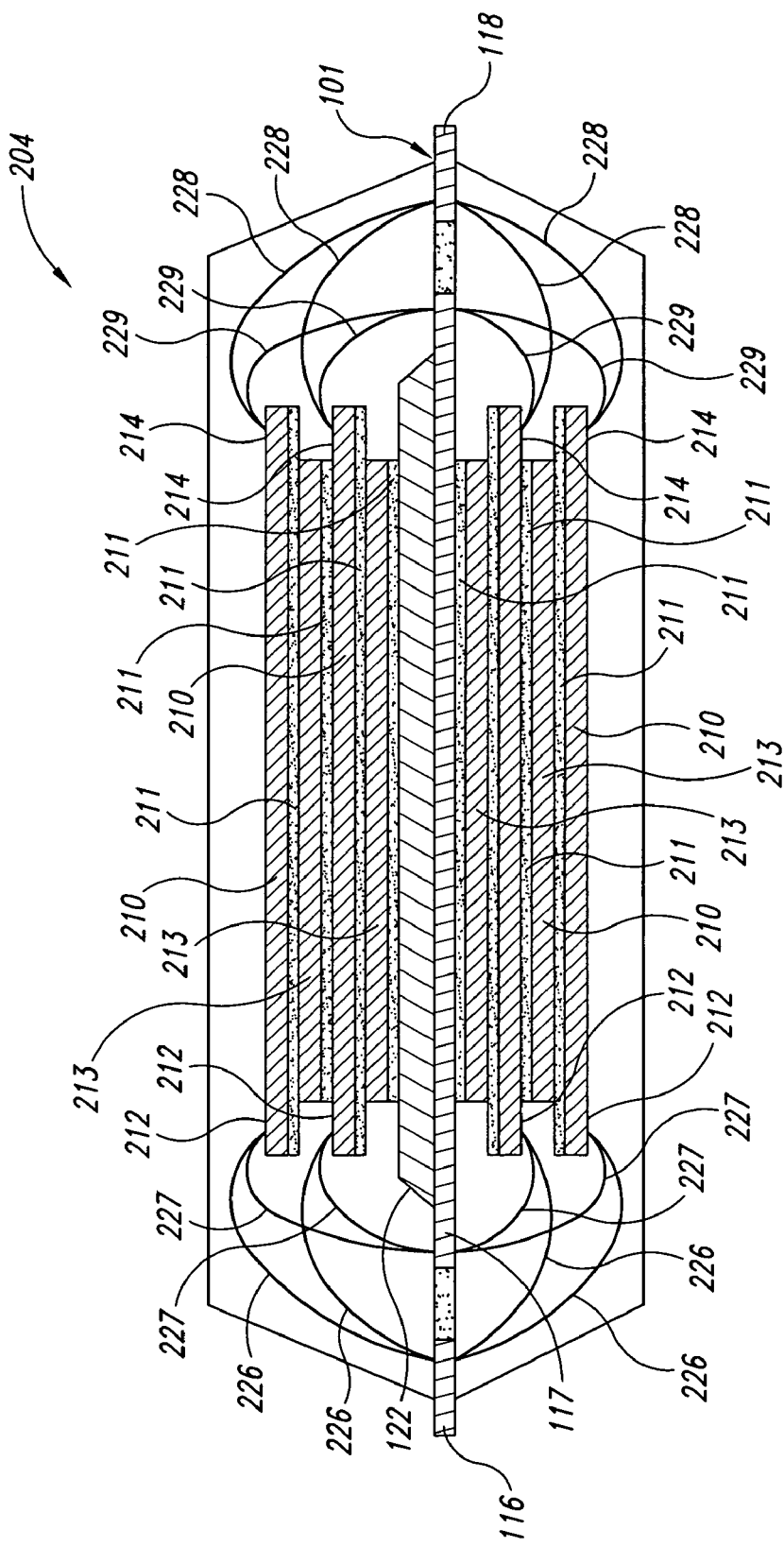
FIG. 12 is a cross-sectional view of a microelectronic device package incorporating multiple microelectronic devices and a pre-encapsulated lead frame having a third lead finger in accordance with another embodiment of the invention.

FIG. 12 illustrates a microelectronic device package 204 incorporating an embodiment of the lead frame 101 described above with reference to FIG. 4. The package 204 can include two microelectronic devices 210 disposed on one side of the lead frame 101, and two microelectronic devices 210 disposed on the other side of the lead frame 101. Spacers 213 separate neighboring microelectronic devices 210. Adhesive layers 211 attach the spacers 213 to the microelectronic devices 210 and the lead frame 101. Each microelectronic device 210 can include first bond pads 212 toward one end of the device and second bond pads 214 toward an (opposite) second end of the device. First wirebonds 226 can electrically connect the first bond pads 212 to the first lead fingers 116, and second wirebonds 228 can electrically connect the second bond pads 214 to the second lead fingers 118. Third and fourth wirebonds 227, 229 can electrically connect the first and second bond pads 212, 214 to the third lead finger 117.

Figure 13:
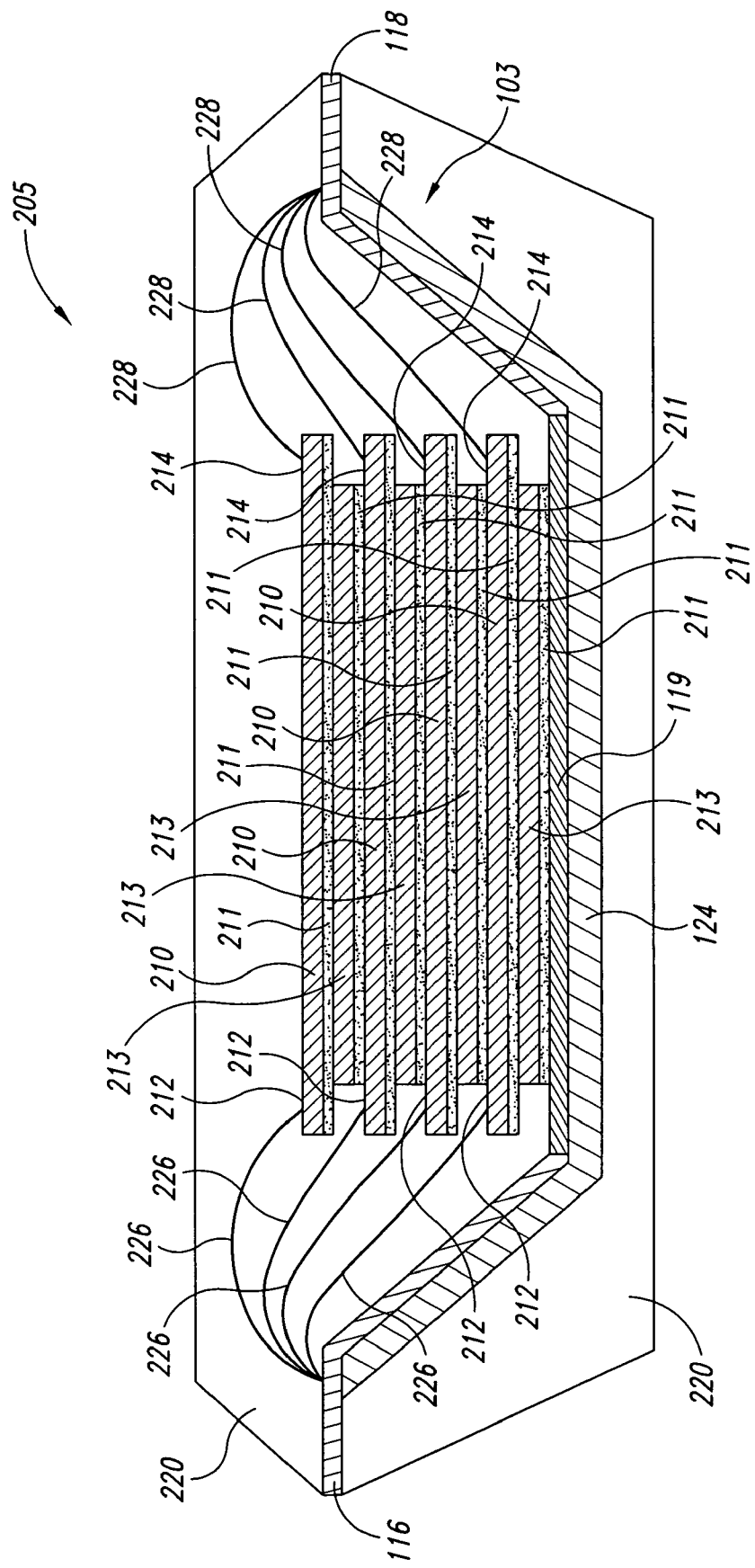
FIG. 13 is a cross-sectional view of a microelectronic device package incorporating multiple microelectronic devices and a pre-encapsulated lead frame having an offset die paddle in accordance with another embodiment of the invention.

FIG. 13 illustrates a microelectronic device package 205 incorporating an embodiment of the lead frame 103 described above with reference to FIG. 6. The package 205 can include four microelectronic devices 210 carried by a recessed portion of the lead frame 103. Spacers 213 separate adjacent microelectronic devices 210, and adhesive layers 211 attach the stacked microelectronic devices 210 to each other and to the lead frame 103. The first wirebonds 226 can electrically connect the first bond pads 212 to the first lead fingers 116, and the second wirebonds 228 can electrically connect the second bond pads 214 to the second lead fingers 118.

Figure 14:
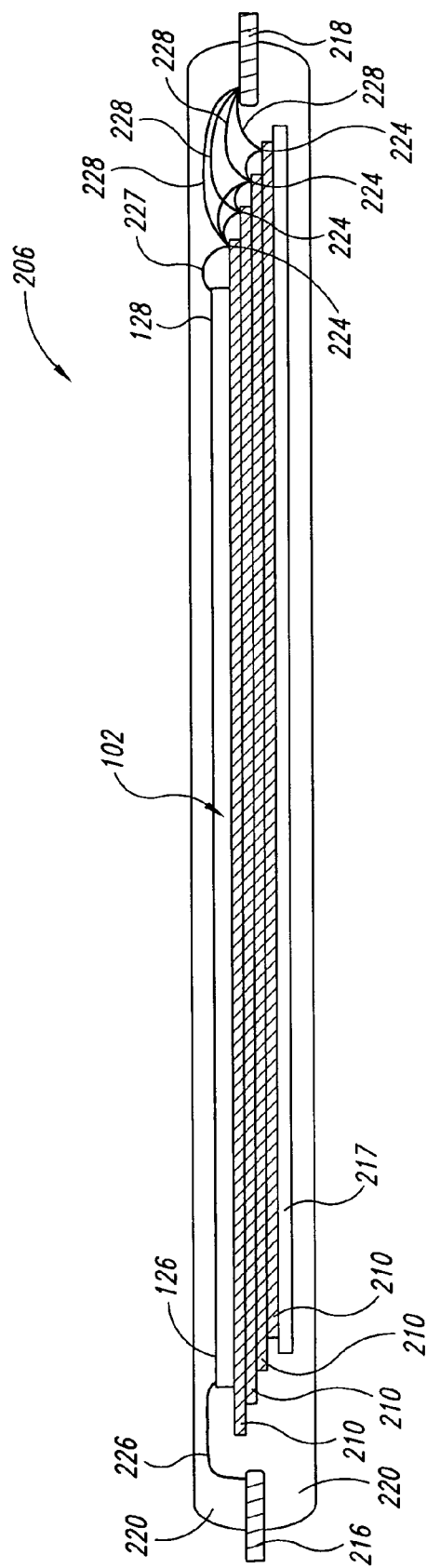
FIG. 14 is a cross-sectional view of a microelectronic device package incorporating multiple microelectronic devices and a signal distributing lead frame in accordance with another embodiment of the invention.

FIG. 14 illustrates a microelectronic device package 206 incorporating an embodiment of the lead frame 102 described above with reference to FIG. 5. The package 206 can include a stack of four microelectronic devices 210 attached to each other with adhesive layers (not shown). The stack of microelectronic devices 210 can be carried by a die paddle 217, or directly by the lead frame 102. The lead frame 102 is disposed on the stack and can facilitate signal distribution to and/or from the microelectronic devices 210, as is described in greater detail later. The first wirebonds 226 can electrically connect the first connection portion 126 of the lead frame 102 to the first lead fingers 216. The second wirebonds 228 can electrically connect the die bond pads 224 to the second lead fingers 218. The third wirebonds 227 can electrically connect the microelectronic devices 210 to the second connection portion 128 of the lead frame 102.

In operation, the lead frame 102 can distribute electrical signals and/or power among the microelectronic devices 210 and external devices (not shown). For example, electrical signals can be transmitted from one of the microelectronic devices 210 to the second connection portion 128 of the lead frame 102. The lead frame 102 can then distribute the electrical signals to the first connection portion 126. The first wirebonds 226 can then transmit the electrical signals from the first connection portion 126 to the first lead fingers 216 to be received by external devices.

An embodiment of the microelectronic device package 206 described above can be manufactured without silicon interposers. In particular, the lead frame 102 can be substituted for a silicon interposer. This is unlike at least some conventional arrangements, which use silicon interposers for distributing electrical signals from the die bond pads 224 to the first lead fingers 216. Such silicon interposers can be complex and costly to fabricate. Accordingly, using the pre-encapsulated lead frame 102 can reduce the cost of distributing electrical signals in the microelectronic device package 206.

Figure 15:
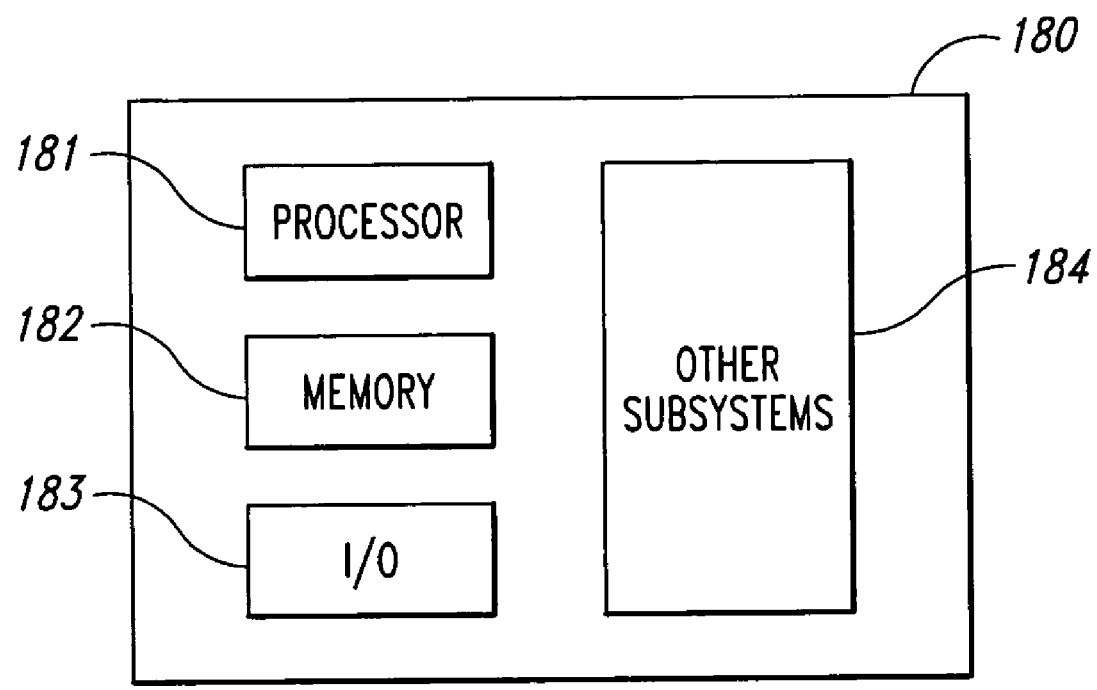
FIG. 15 is a block diagram of a system that can include microelectronic device packages with pre-encapsulated lead frames configured in accordance with embodiments of the invention.

Individual microelectronic device packages 200-205 may be incorporated into any of a myriad of larger and/or more complex systems 180, a representative one of which is shown schematically in FIG. 15. The system 180 can include a processor 181, a memory 182 (e.g., SRAM, DRAM, Flash, and/or other memory device), input/output devices 183, and/or other subsystems or components 184. Individual microelectronic device packages 200-205 may be included in any of the components shown in FIG. 15. The resulting system 180 can perform any of a wide variety of computing, processing, storage, sensor and/or other functions. Accordingly, representative systems 180 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and mini computers. Other representative systems 180 include cameras, light or other radiation sensors, servers and associated server subsystems, display devices, and/or memory devices. Components of the system 180 may be housed in a single unit or distributed over multiple, interconnected units, e.g., through a communications network. Components can accordingly include local and/or remote memory storage devices, and any of a wide variety of computer-readable media.

From the foregoing, it will be appreciated that specific embodiments of the invention have been described herein for purposes of illustration, but that various modifications may be made without deviating from the invention. For example, the microelectronic device packages 200-206 shown in FIGS. 8-14 can incorporate any of the pre-encapsulated lead frames 100-104 shown in FIGS. 2-7. The microelectronic devices may be stacked and/or arranged in manners other than those shown in the Figures. Features of various embodiments described above may be combined or eliminated in other embodiments. For example, individual lead finger configurations shown in FIGS. 2-7 may be combined with each other. In addition, the microelectronic device packages may include components in addition to and/or other than those shown in the Figures. Accordingly, the invention is not limited except as by the appended claims.

We claim:

1. A method for assembling a microelectronic device package, comprising:
    disposing an encapsulating compound in gaps between adjacent lead fingers;
    molding a strengthening layer over portions of the lead fingers and the encapsulating compound to form a pre-encapsulated lead frame;
    supporting the microelectronic device with at least a portion of the strengthening layer when the microelectronic device is positioned on the pre-encapsulated lead frame;
    electrically coupling the microelectronic device to the lead fingers of the pre-encapsulated lead frame after the strengthening layer has been formed, wherein the strengthening layer supports the microelectronic device as the microelectronic device is electrically coupled to the lead finger; and
    encapsulating the microelectronic device and the pre-encapsulated lead frame in a package.

2. The method of claim 1 wherein the method further comprises completely filling the gaps between adjacent lead fingers with the encapsulating compound.

3. The method of claim 1 wherein disposing an encapsulating compound includes disposing the encapsulating compound in the gaps between adjacent lead fingers, the encapsulating compound having a thickness no greater than a thickness of the lead fingers.

4. The method of claim 1 wherein disposing an encapsulating compound includes disposing the encapsulating compound in the gaps between adjacent lead fingers, the encapsulating compound having a thickness generally equal to a thickness of the lead fingers.

5. The method of claim 1 wherein disposing the encapsulating compound further includes disposing the encapsulating compound on the lead fingers external to gaps between neighboring lead fingers.

6. The method of claim 1 wherein the encapsulating compound is a first encapsulating compound, and wherein molding the strengthening layer includes disposing a layer of a second encapsulating compound on the lead fingers, the second encapsulating compound having a composition different than a composition of the first encapsulating compound.

7. The method of claim 1 wherein the lead fingers are first lead fingers, and wherein disposing an encapsulating compound further includes disposing the encapsulating compound in gaps between adjacent second lead fingers.

8. The method of claim 7 wherein the second lead fingers are spaced apart in a lengthwise direction from the first lead fingers by a space, and wherein disposing the encapsulating compound further includes completely filling the space with the encapsulating compound.

9. The method of claim 1, further comprising at least restricting movement of the lead fingers from a common plane.

10. The method of claim 1 wherein the microelectronic device is a first microelectronic device, and wherein the method further comprises:
  attaching a second microelectronic device to the first microelectronic device; and
  electrically coupling the second microelectronic device to the lead fingers of the pre-encapsulated lead frame.

11. The method of claim 1 wherein individual lead fingers have a first surface and a second surface opposite the first surface, and wherein molding a strengthening layer further comprises:
  molding a first strengthening layer over portions of the first surfaces of the lead fingers and the encapsulating compound; and
  molding a second strengthening layer over portions of the second surfaces of the lead fingers and the encapsulating compound.

12. A method for assembling a lead frame, comprising:
  disposing a set of lead fingers into a molding cavity, the individual lead fingers having a first surface and a second surface opposite the first surface;
  encapsulating the set of lead fingers with an encapsulating compound in the molding cavity;
  molding a first strengthening layer over portions of the first surfaces of the lead fingers and the encapsulating compound;
  molding a second strengthening layer over portions of the second surfaces of the lead fingers and the encapsulating compound; and
  forming a sheet-like structure with the set of lead fingers, the encapsulating compound, and the first and second strengthening layers without encapsulating a microelectronic device, wherein one of the first and second strengthening layer is configured to support the microelectronic device before the microelectronic device is electrically coupled to the lead fingers.

13. The method of claim 12, further comprising fastening the set of lead fingers in a desired arrangement with at least one removable fastener prior to encapsulating the lead fingers.

14. The method of claim 12 wherein encapsulating the set of lead fingers includes applying a liquefied encapsulating compound to the set of lead fingers in the molding cavity.

15. The method of claim 12 wherein the first and second strengthening layers comprise at least one of the encapsulating compound and a material having a different composition than the encapsulating compound.

16. A method for assembling a lead frame, comprising:
  disposing a first set of lead fingers into a molding cavity;
  encapsulating the first set of lead fingers with an encapsulating compound in the molding cavity;
  molding a strengthening layer over portions of the first set of lead fingers and the encapsulating compound without encapsulating a microelectronic device, wherein at least a portion of the strengthening layer is configured to support the microelectronic device before the microelectronic device is electrically coupled to the lead fingers; and
  positioning a second set of lead fingers in the molding cavity, the second set of lead fingers being spaced apart from the first set of lead fingers in a lengthwise direction, with the first and second sets of lead fingers positioned in a common plane.

17. The method of claim 16, further comprising:
  encapsulating the first and second sets of lead fingers together; and
  at least restricting movement of the first and second sets of lead fingers from the common plane.

18. The method of claim 16 wherein the first and second sets of lead fingers are located in a first plane, and wherein the method further includes positioning a third set of lead fingers in the molding cavity, the third set of lead fingers being located on a second plane offset from the first plane.

19. The method of claim 16 wherein the strengthening layer comprises at least one of the encapsulating compound and a material having a different composition than the encapsulating compound.

20. The method of claim 16 wherein individual lead fingers have a first surface and a second surface opposite the first surface, and wherein molding the strengthening layer further comprises:
  molding a first strengthening layer over portions of the first surfaces of the lead fingers and the encapsulating compound; and
  molding a second strengthening layer over portions of the second surfaces of the lead fingers and the encapsulating compound.

21. A method for assembling a microelectronic device package, comprising:
  arranging a plurality of lead fingers in a side-by-side arrangement, individual adjacent lead fingers being separated from each other by a gap;
  disposing a first encapsulating compound in the gaps;
  molding a first strengthening layer over portions of the first surfaces of the lead fingers and the first encapsulating compound;
  forming a sheet-like structure with the lead fingers, the first encapsulating compound in the gaps, and the first strengthening layer;
  positioning a semiconductor die on at least a portion of the first strengthening layer;
  electrically coupling the semiconductor die to the lead fingers after the first strengthening layer is formed, wherein the first strengthening layer supports the semiconductor die as it is electrically coupled to the lead fingers; and
  at least partially encapsulating the semiconductor die and the sheet-like structure with a second encapsulating compound.

22. The method of claim 21 wherein:
  the lead fingers are first lead fingers, the individual first lead fingers including a first connection portion, a second connection portion opposite the first connection portion in a lengthwise direction, and a support portion between the first and second connection portions;
  the gaps are first gaps;
  the method also includes arranging a plurality of second lead fingers spaced apart from the first lead fingers by a space in the lengthwise direction, individual adjacent second lead fingers being separated from each other by a second gap;

disposing a first encapsulating compound includes disposing the first encapsulating compound in the first gaps, the second gaps, and the space between the first and second lead fingers in a first molding operation, the disposed first encapsulating compound having a thickness less than a thickness of the first lead fingers;

molding a first strengthening layer includes molding the first strengthening layer over the support portions of the first lead fingers;

forming a sheet-like structure includes forming a sheet-like structure with the first lead fingers, the second lead fingers, the first encapsulating compound in the first and second gaps and the space between the first and second sets of the lead fingers, and the first strengthening layer over the support portions of the first lead fingers;

positioning a semiconductor die includes positioning the semiconductor die on the sheet-like structure, the semiconductor die having a plurality of bond sites;

the method also includes:
attaching the semiconductor die to the first strengthening layer;
wirebonding the bond sites of the semiconductor die to at least one of the second connection portion of the individual first lead fingers and one of the second lead fingers; and
at least partially encapsulating a semiconductor die includes at least partially encapsulating the semiconductor die and the sheet-like structure with a second encapsulating compound different than the first encapsulating compound in a second molding operation independent of the first molding operation.

23. The method of claim 21 wherein disposing a first encapsulating compound includes disposing the first encapsulating compound in the gaps between the individual adjacent lead fingers, the disposed first encapsulating compound having a thickness less than a thickness of the lead fingers.

24. The method of claim 21 wherein:
the individual lead fingers have a first surface and a second surface opposite the first surface;
molding a first strengthening layer includes molding the first strengthening layer over portions of the first surfaces of the lead fingers and the encapsulating compound;
the method further includes:
molding a second strengthening layer over portions of the second surfaces of the lead fingers and the encapsulating compound; and
strengthening the sheet-like structure with the first and second strengthening layers.

25. The method of claim 21 wherein:
the lead fingers are first lead fingers;
the method further includes:
arranging a plurality of second lead fingers spaced apart from the first lead fingers by a space in a lengthwise direction; and
disposing the first encapsulating compound in the space between the first and second sets of lead fingers.

26. The method of claim 21 wherein:
the lead fingers are first lead fingers;
the method further includes:
arranging second lead fingers spaced apart from the first lead fingers by a space in a lengthwise direction; and
maintaining a generally co-planar alignment between the first and second lead fingers during positioning the semiconductor die on the sheet-like structure.

27. The method of claim 21 wherein:
the lead fingers are first lead fingers;
the method further includes:
arranging second lead fingers spaced apart from the first lead fingers by a space in a lengthwise direction; and
at least reducing shifting one of the first and second lead fingers relative to other first and second lead fingers during positioning the semiconductor die on the sheet-like structure.

28. The method of claim 21 wherein:
forming a sheet-like structure includes forming the sheet-like structure in a first molding operation; and
at least partially encapsulating the semiconductor die includes at least partially encapsulating the semiconductor die and the sheet-like structure with the second encapsulating compound in a second molding operation independent of the first molding operation.

29. The method of claim 21 wherein the first strengthening layer comprises at least one of the encapsulating compound and a material having a different composition than the first encapsulating compound.

30. A method for assembling a microelectronic device package, comprising:
supporting a semiconductor die with a sheet-like structure, the sheet-like structure including a plurality of lead fingers encapsulated by a first encapsulating compound and a strengthening layer, the strengthening layer being over portions of the lead fingers and the encapsulating compound, the individual adjacent lead fingers being separated from each other by a gap filled with the first encapsulating compound, wherein the semiconductor die is positioned by at least a portion of the strengthening layer;
placing a wirebond between a bond site of the semiconductor die and at least one of the lead fingers of the sheet-like structure after the strengthening layer has been formed; and
encapsulating the semiconductor die, the wirebond, and at least a portion of the sheet-like structure with a second encapsulating compound.

31. The method of claim 30 wherein:
the lead fingers are first lead fingers, the individual first lead fingers including a first connection portion, a second connection portion opposite the first connection portion in a lengthwise direction, and a support portion between the first and second connection portions;
the gaps are first gaps;
the sheet-like structure also includes a plurality of second lead fingers spaced apart from the first lead fingers by a space in the lengthwise direction, individual adjacent second lead fingers being separated from each other by a second gap filled with the first encapsulating compound, the space being filled with the first encapsulating compound;
supporting a semiconductor die includes:
supporting the semiconductor die with the support portions of the first lead fingers; and
encapsulating the semiconductor die includes encapsulating the semiconductor die and the sheet-like structure with a second encapsulating compound different than the first encapsulating compound.

32. The method of claim 30 wherein supporting a semiconductor die includes supporting a semiconductor die with a sheet-like structure, the sheet-like structure including a plurality of lead fingers encapsulated by a first encapsulating compound, the individual adjacent lead fingers being separated from each other by a gap filled with the first encapsulating compound, wherein the first encapsulating compound has a thickness less than a thickness of the lead fingers.

33. The method of claim 30 wherein:

the individual lead fingers have a first surface and a second surface opposite the first surface;

supporting a semiconductor die includes supporting a semiconductor die with a sheet-like structure, the sheet-like structure including a plurality of lead fingers encapsulated by a first encapsulating compound and a strengthening layer wherein:

the strengthening layer includes a first strengthening layer and a second strengthening layer;

the first strengthening layer is on portions of the first surfaces of the individual lead fingers;

the second strengthening layer is on portions of the second surfaces of the individual lead fingers; and the method further includes strengthening the sheet-like structure with the first and second strengthening layers.

34. The method of claim 30 wherein:

the lead fingers are first lead fingers; and supporting a semiconductor die includes supporting a semiconductor die with a sheet-like structure, the sheet-like structure further including a plurality of second lead fingers spaced apart from the first lead fingers by a space in a lengthwise direction, the space being filled with a portion of the first encapsulating compound.

35. The method of claim 30 wherein the strengthening layer comprises at least one of the encapsulating compound and a material having a different composition than the first encapsulating compound.

* * * * *

UNITED STATES PATENT AND TRADEMARK OFFICE
CERTIFICATE OF CORRECTION

PATENT NO. : 8,357,566 B2  
APPLICATION NO. : 11/510026  
DATED : January 22, 2013  
INVENTOR(S) : Ai-Chie Wang et al.

Page 1 of 1

It is certified that error appears in the above-identified patent and that said Letters Patent is hereby corrected as shown below:

In column 10, line 40, in Claim 1, delete "finger;" and insert -- fingers; --, therefor.

Signed and Sealed this  
Ninth Day of April, 2013

Teresa Stanek Rea  
*Acting Director of the United States Patent and Trademark Office*